(12) United States Patent
Li

(10) Patent No.: US 7,495,919 B2
(45) Date of Patent: Feb. 24, 2009

(54) HEAT SINK ASSEMBLY HAVING A LOCKING DEVICE ASSEMBLY

(75) Inventor: Dong-Yun Li, Shenzhen (CN)

(73) Assignees: Fu Zhun Precision Industry (Shen Zhen) Co., Ltd., Shenzhen, Guandong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/755,655

(22) Filed: May 30, 2007

(65) Prior Publication Data

US 2008/0298022 A1  Dec. 4, 2008

(51) Int. Cl.
*H05K 7/20* (2006.01)

(52) U.S. Cl. .................. 361/710; 361/704; 361/719; 165/80.3; 174/16.3; 174/252

(58) Field of Classification Search .......... 361/687, 361/702–712, 717–724; 165/80.2, 80.3, 165/80.4, 80.5, 104.33, 185; 257/706–727; 174/15.1, 16.3, 252; 24/295, 297, 457, 458, 24/495, 505, 517, 546; 248/316.7, 505, 510
See application file for complete search history.

(56) References Cited

U.S. PATENT DOCUMENTS

| | | | |
|---|---|---|---|
| 5,953,212 A * | 9/1999 | Lee | 361/709 |
| 6,229,703 B1 * | 5/2001 | Lee | 361/704 |
| 6,492,202 B1 * | 12/2002 | Lober et al. | 438/122 |
| 6,496,371 B2 * | 12/2002 | Winkel et al. | 361/703 |
| 6,538,891 B1 * | 3/2003 | He et al. | 361/704 |
| 6,683,449 B1 * | 1/2004 | Bell et al. | 324/158.1 |
| 6,734,371 B2 * | 5/2004 | Arrigotti et al. | 174/260 |
| 7,203,066 B2 | 4/2007 | Lee et al. | |
| 7,375,965 B2 * | 5/2008 | Xia et al. | 361/704 |
| 2007/0103870 A1 * | 5/2007 | Li et al. | 361/704 |

* cited by examiner

*Primary Examiner*—Michael V Datskovskiy
(74) *Attorney, Agent, or Firm*—Frank R. Niranjan

(57) ABSTRACT

A heat sink assembly comprises a heat sink (20) and a locking device assembly (30) for mounting the heat sink to an electronic component (44) of a printed circuit board (40). A channel (25) is defined in the heat sink. The locking device assembly comprises a pressing member (31) and a pair of wire clips (33) pivotably engaging with opposite ends of the pressing member. The pressing member spans across the channel in a manner such that the pressing member resiliently abuts against the heat sink. The wire clips are located at opposite lateral sides of the heat sink and engage with clasps (42) on the printed circuit board. Use of the locking device assembly can prevent the heat sink from being held at a slant relative to the electronic component.

17 Claims, 5 Drawing Sheets

HEAT SINK ASSEMBLY HAVING A LOCKING DEVICE ASSEMBLY

BACKGROUND OF THE INVENTION

1. Field of the Invention

The present invention relates to a heat sink assembly, and more particularly to a heat sink assembly having a heat sink and a locking device assembly, wherein the locking device assembly can reliably secure the heat sink on an electronic device.

2. Description of Related Art

Advances in microelectronics technology have resulted in electronic devices which process signals and data at unprecedented high speeds. During operation of many contemporary electronic devices such as central processing units (CPUs), solid-state circuits, and light emitting diode (LED) display units, large amounts of heat are produced. This heat must be efficiently removed to prevent the system from becoming unstable or being damaged.

Typically, a heat sink assembly comprises a heat sink attached to an outer surface of the electronic device to facilitate removal of heat therefrom and a pair of clips. The clips are attached to two opposite sides of the heat sink to provide pressure for securing the heat sink on the electronic device. Chinese patent issue No. 200320117746.8 shows an example of this kind of heat sink assembly. However, when one of the clips is deformed unexpectedly, the corresponding pressure provided by the clip is changed, and a pressure difference is produced between two sides of the heat sink such that the heat sink is prone to fixed at a slant to the electronic device, whereby the heat sink cannot intimately contact the electronic device, and the efficiency of heat dissipation is thus lowered.

An improved heat sink assembly which overcomes the above problems, is desired.

SUMMARY OF THE INVENTION

A heat sink assembly comprises a heat sink and a locking device assembly for mounting the heat sink to an electronic component of a printed circuit board. A channel is defined in the heat sink. The locking device assembly comprises a pressing member and a pair of wire clips pivotably engaging with opposite ends of the pressing member. The pressing member spans across the channel in a manner such that the pressing member resiliently abuts against the heat sink. The wire clips are located at opposite lateral sides of the heat sink and engage with clasps on the printed circuit board. Slanting of the heat sink relative to the electronic component to cause a bad heat dissipation of the electronic component is thus prevented by use of the locking device assembly.

Other advantages and novel features will become more apparent from the following detailed description of preferred embodiments when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
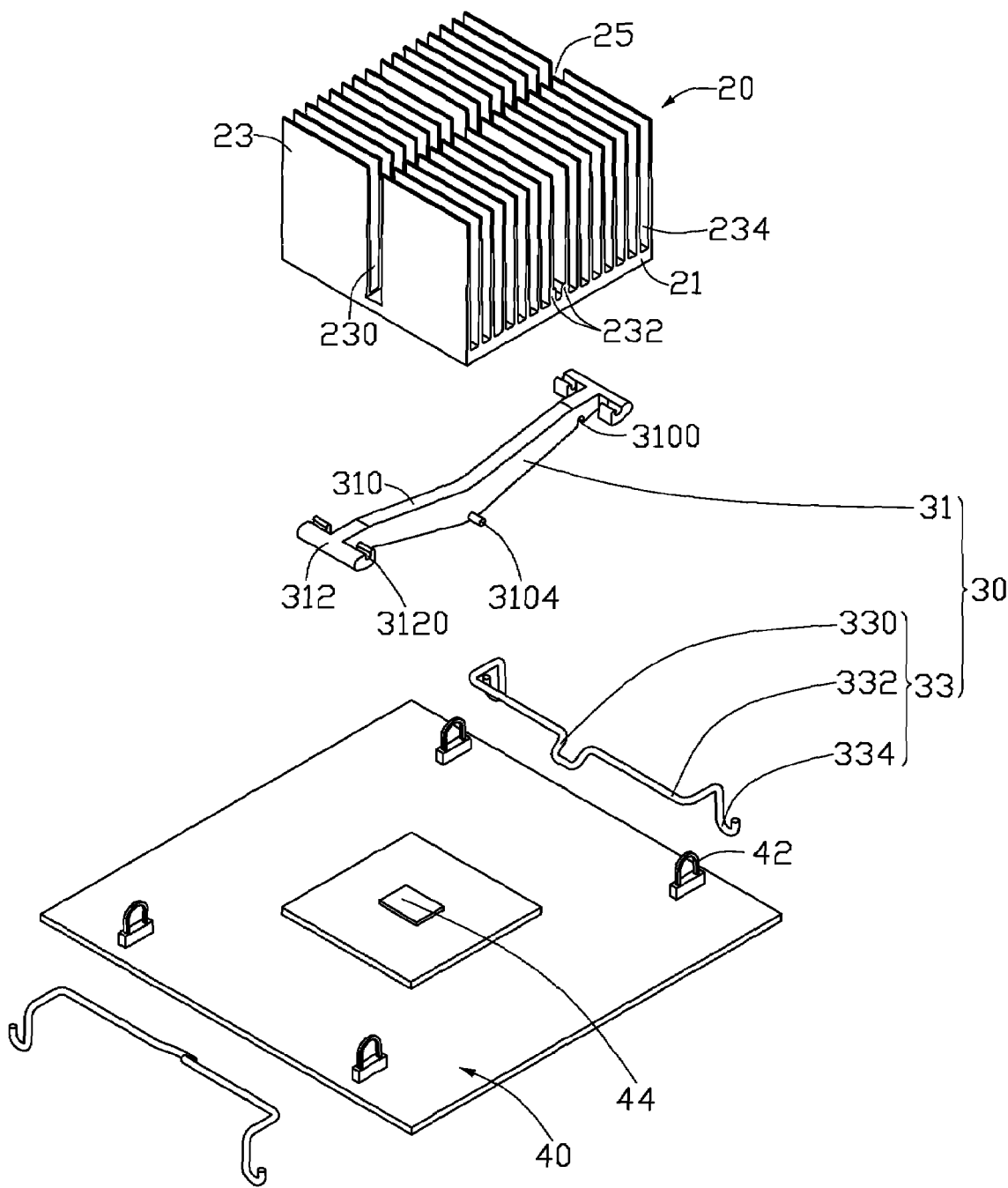
FIG. 1 is an exploded, isometric view of a heat sink assembly in accordance with a preferred embodiment of the present invention, together with a printed circuit board.
Figure 2:
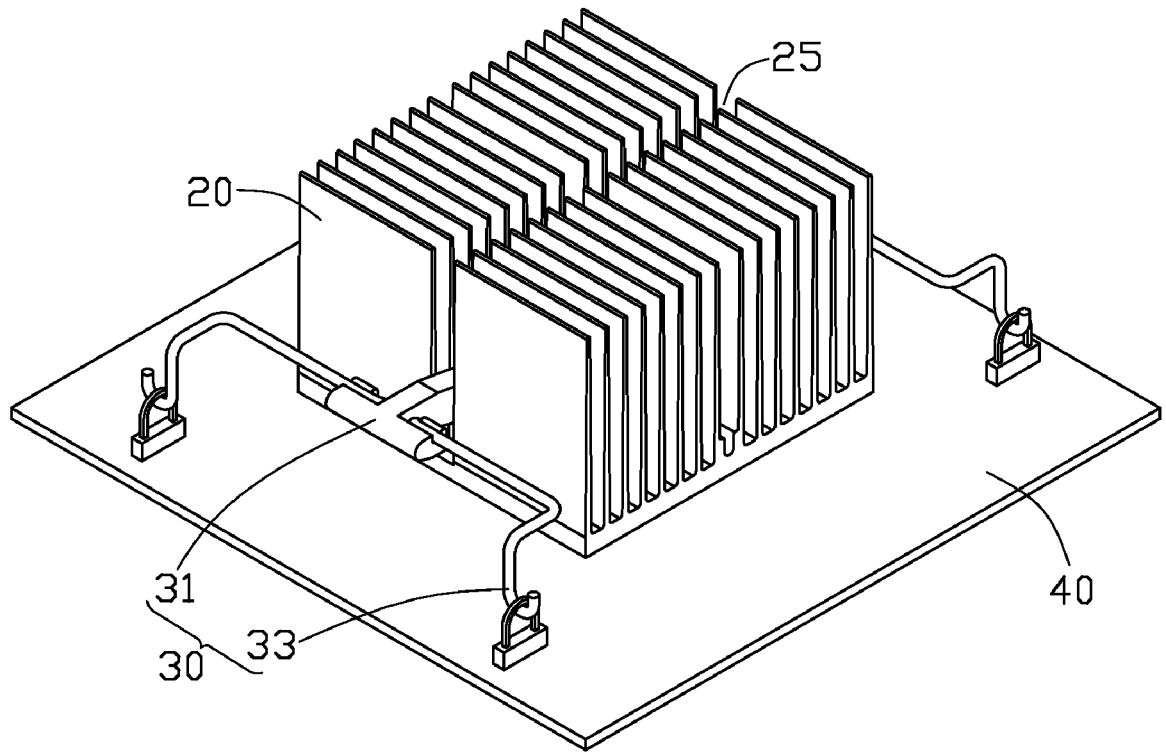
FIG. 2 is an assembled view of FIG. 1.

FIGS. 1-2 show a heat sink assembly in accordance with a preferred embodiment of the present invention. The heat sink assembly is mounted on a printed circuit board 40 and used for dissipating heat generated by an electronic component 44 mounted on the printed circuit board 40. The heat sink assembly comprises a heat sink 20 and a locking device assembly 30. The printed circuit board 40 forms four clasps 42 around the electronic component 44.

The heat sink 20 has a base 21 with a bottom face thermally contacting with the electronic component 44, and a plurality of parallel fins 23 extending upwardly from a top face of the base 21. The fins 23 are spaced evenly from each other so that a plurality of parallel passages 234 is defined between the fins 23. Each fin 23 defines a rectangular cutout 230 at a center thereof in such a manner that the cutouts 230 communicate with each other to cooperatively define a channel 25 for receiving a corresponding portion of the locking device assembly 30 therein. An extending direction of the channel 25 is oriented perpendicular to the passages 234 between the fins 23. Two neighboring fins 23 located at a middle of the heat sink 20 are projected to each other in bottom portions thereof, to thereby form a pair of bulges 232. A distance between the bulges 232 is less than that between the two neighboring fins 23.

Figure 4:
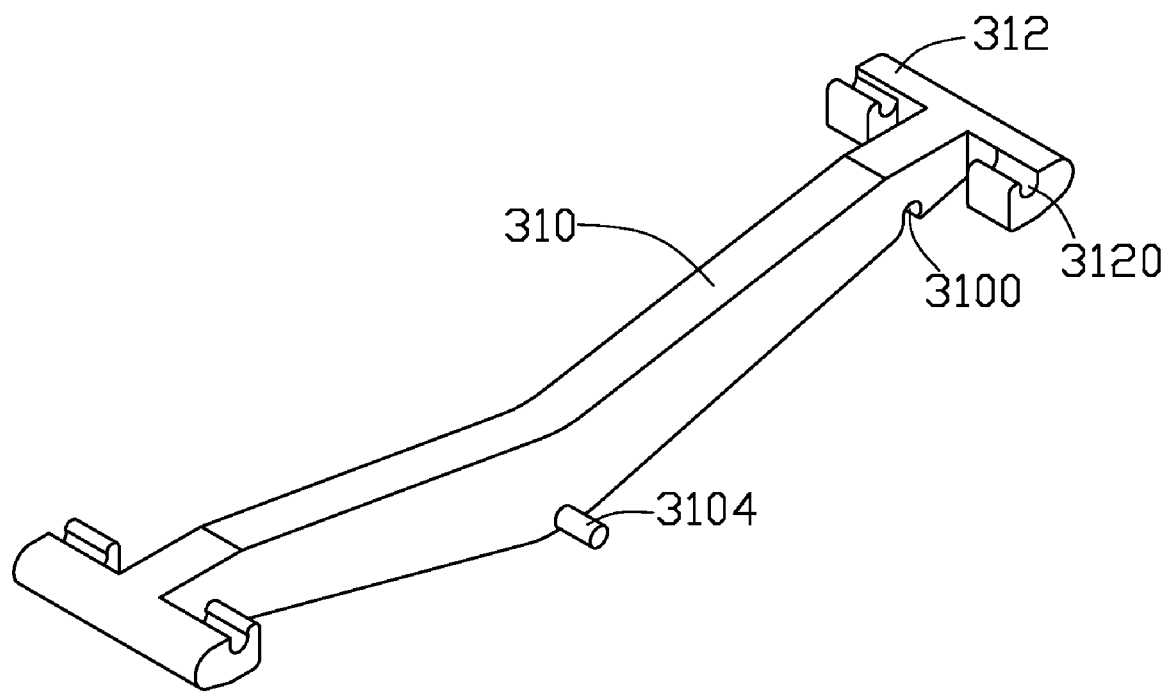
FIG. 4 is an enlarged view of a pressing member of a locking assembly device of the heat sink assembly of FIG. 1.
Figure 5:
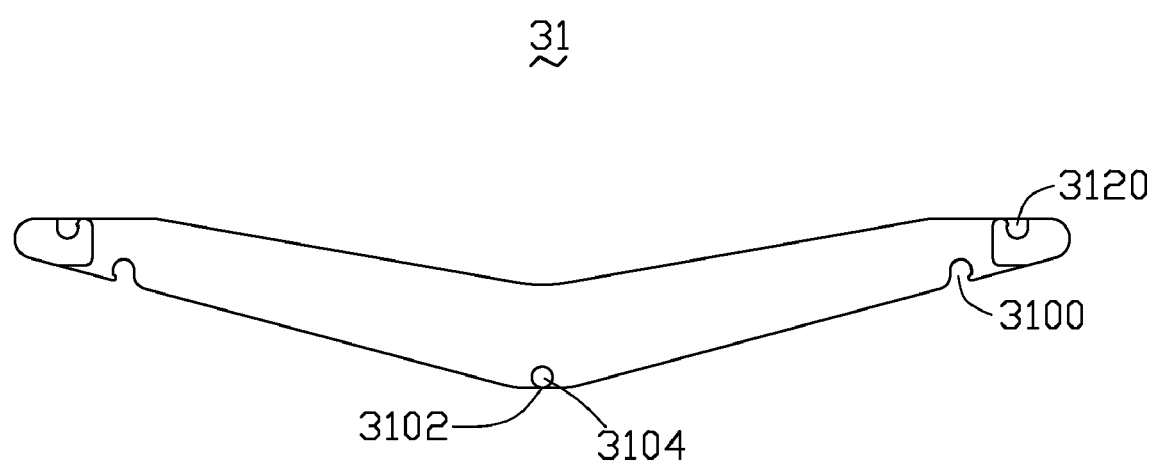
FIG. 5 is a front view of FIG. 4.

The locking device assembly 30 comprises a pressing member 31 spanning across the channel 25 of the heat sink 20 and two wire clips 33 pivotably mounted on opposite two ends of the pressing member 31. Referring to FIGS. 4-5, the pressing member 31 comprises two elongated arms 310 connecting with each other slantwise to from a V-shaped configuration, and a pair of connecting members 312 extending outwardly and horizontally from free ends of the arms 310. Each arm 310 defines a slot 3100 at a lower face and adjacent to an end portion thereof. A rectangular bottom face 3102 is defined at a joint of the two arms 310 in such a manner that a resilient contact exists between the pressing member 31 and the top face of the base 21 of the heat sink 20 in the channel 25. A pair of posts 3104 extend perpendicularly and horizontally from two outer lateral sides of the pressing member 31 at the joint of the two arms 310 and adjacent to the bottom face 3102 of the pressing member 31. The posts 3104 can be received in a gap between the two bulges 232 of the heat sink 20 for stabilizing a rotation of the pressing member 31 in the channel and limiting linear movement of the pressing member 31 in the channel 25 of the heat sink 20. Each connecting member 312 comprises a main body (not labeled) having a half-cylinder configuration, and a pair of protrusions (not labeled) inwardly projecting from two lateral sides of the main body. Each protrusion defines a groove 3120 at a top face thereof in such a manner that the wire clips 33 can be engaged in the grooves 3120.

Referring to FIG. 1 again, one of the wire clips 33 will be described in detail since both are identical in construction, function and operation. The wire clip 33 can be made from a single piece of resilient wire. The wire clip 33 comprises an engaging portion 330, a pair of extension portions 332 extending outwardly and perpendicularly from opposite ends of the engaging portion 330, and a pair of locking portions 334 formed downwardly on free ends of the extension portions 332. The engaging portion 330 is U-shaped and located in a central portion of the wire clip 33. The extension portion 332 is L-shaped. The locking portion 334 can be a hook or similar locking device. A plane defined by the engaging portion 330 has an acute angle with another plane defined by the extension portions 332. When the engaging portion 330 of the wire clip 33 is engaged in the slot 3100 of the pressing member 31, the extension portions 332 of the wire clip 33 are engaged in the grooves 3120 of the pressing member 31, and the locking portions 334 of the wire clip 33 engage with the corresponding clasps 42 of the printed circuit board 40, the pressing member 31 is urged to downwardly press the heat sink 20, whereby the heat sink 20 can be in intimate contact with the electronic component 44.

Figure 3:
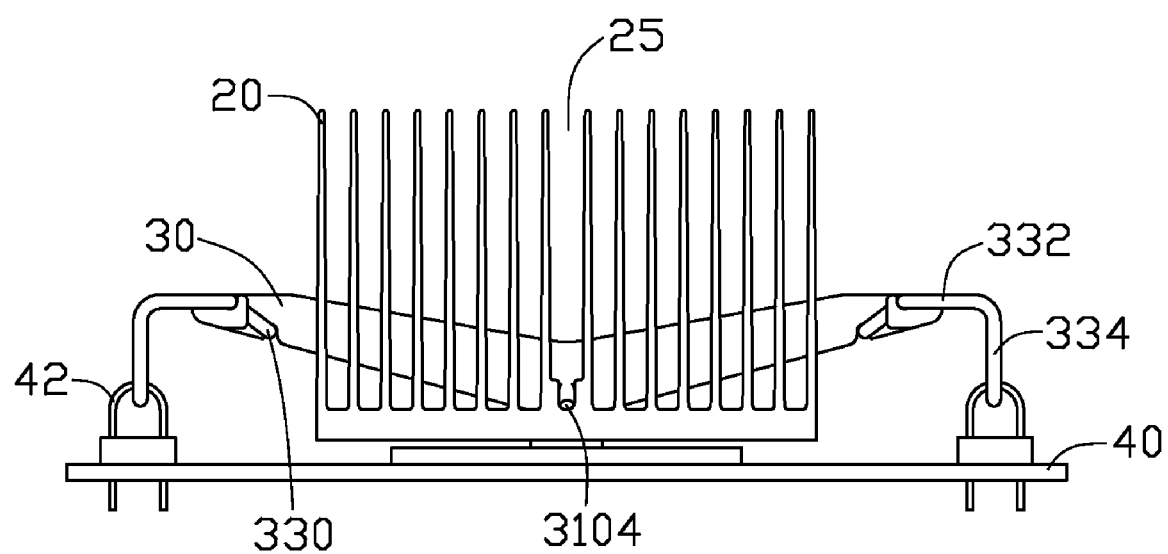
FIG. 3 is a front view of FIG. 2.

Referring to FIGS. 1-3, in assembly, the heat sink 20 is disposed on the electronic component 44. The wire clips 33 pivotably engage with the opposite ends of the pressing member 31 to cooperatively construct the locking device assembly 30 in such a manner that the engaging portion 330 of each wire clip 33 is engaged in the slot 3100 of the pressing member 31 and the extension portions 332 of each wire clip 33 are engaged in the grooves 3120 of the pressing member 31. The pressing member 31 of the locking device assembly 30 is disposed in the channel 25 of the heat sink 20 in a manner such that the bottom face 3102 of the pressing member 31 abuts against the top face of the base 21 in the channel 25 of the heat sink 20 and the posts 3104 of the pressing member 31 are pivotably received between the two bulges 232 of the heat sink 20, thus positioning the wire clips 33 on opposite lateral sides of the heat sink 20. The four locking portions 334 of the wire clips 33 are locked into the corresponding clasps 42 of the printed circuit board 40, so that locking force is provided to the wire clips 33 and the pressing member 31 with a downward pressure corresponding to the locking force pressing downwardly on the heat sink 20 towards the electronic component 44, thus holding the heat sink 20 in intimate contact with the electronic component 44.

The heat sink 20 of the present invention has one contact face with the locking device assembly 30, the pressure provided by the pressing member 31 can converge on the contact face of the heat sink 20. When one of the wire clips 33 is deformed unexpectedly, due to the resilience of the pressing member 31, the pressure can be maintained at a original position and oriented to a original direction so that the heat sink 20 will not be easily slanted relative to the electronic component 44, whereby the heat sink 20 reliably contacts with the electronic component 44.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly for dissipating heat generated by an electronic component mounted on a printed circuit board, the heat sink assembly comprising:

a heat sink comprising a base and a plurality of fins extending from the base, a channel being defined in the heat sink; and a locking device assembly mounted on the heat sink and adapted for securing the heat sink on the electronic component, the locking device assembly comprising:

a pressing member spanning across the channel in a manner such that the pressing member resiliently abuts against the heat sink; and a pair of wire clips pivotably mounted on opposite ends of the pressing member, the wire clips being located on opposite lateral sides of the heat sink and adapted for engaging with the printed circuit board, wherein the pressing member comprises two elongated arms connecting with each other to form a V-shaped configuration.

2. The heat sink assembly as claimed in claim 1, wherein the pressing member further comprises a pair of connecting members formed at free ends of the two arms thereof, said wire clips pivotably engage with the connecting member.

3. The heat sink assembly as claimed in claim 2, wherein each of the arms defines a slot at a bottom face adjacent to a free end portion thereof and each of the connecting members defines two grooves on a top face of two lateral sides thereof to engage with a corresponding wire clip.

4. The heat sink assembly as claimed in claim 3, wherein a pair of posts are horizontally formed at a joint of the arms and located at outer lateral sides of the pressing member.

5. The heat sink assembly as claimed in claim 4, wherein each of the wire clips comprises an engaging portion, two extension portions extending outwardly and symmetrically from free ends of the engaging portion, and a pair of locking portions downwardly formed at free ends of the extension portions.

6. The heat sink assembly as claimed in claim 5, wherein the engaging portion is engaged in the slot of the arm, the extension portions are engaged in the grooves of the connecting member and the locking portions and adapted for securing with the printed circuit board.

7. The heat sink assembly as claimed in claim 5, wherein the engaging portion is U-shaped, the extension portion is L-shaped and the locking portion is a hook.

8. The heat sink assembly as claimed in claim 5, wherein a plane defined by the extension portion is oriented at an acute angle to a plane defined by the engaging portion.

9. The heat sink assembly as claimed in claim 4, wherein each of the fins defines a cutout in a central area thereof such that the cutouts cooperatively define the channel of the heat sink, and a plurality of parallel passages is defined between the fins, and an extension direction of the channel is perpendicular to the passages.

10. The heat sink assembly as claimed in claim 9, wherein two adjacent fins located at the middle of the heat sink project an angle so oriented as to each other to form a pair of bulges near the base allowing the posts of the pressing member to be received between the two bulges.

11. A locking device assembly adapted for mounting a heat sink on a printed circuit board comprising:

a pressing member for spanning across and abutting against the heat sink; and two wire clips pivotably mounted on two free ends of the pressing member, adapted for securing the pressing member together with the heat sink to the printed circuit board, wherein the pressing member comprises two arms connecting with each other at a slant in a manner such that the arms form a V-shape.

12. The locking device assembly as claimed in claim 11, wherein a pair of connecting members are formed horizontally at free ends of the arms, and the wire clips are pivotably mounted on the connecting members.

13. The locking device assembly as claimed in claim 12, wherein each of the arms defines a slot on a lower face and adjacent to an end portion thereof, each of the connecting members defines two grooves on two lateral sides of a top face thereof.

14. The locking device assembly as claimed in claim 13, wherein each of the wire clips comprises a U-shaped engaging portion, two L-shaped extension portions outwardly extending from the securing member and a pair of hooks functioning as locking portions downwardly formed at free ends of the extension portions.

15. The locking device assembly as claimed in claim 14, wherein the engaging portion is engaged in the slot of the arm, the extension portions are engaged in the grooves of the connecting member and the locking portions adapted for securing with the printed circuit board.

16. An electronic assembly comprising:

a printed circuit board;

an electronic component mounted on the printed circuit board; and a heat sink assembly dissipating heat generated by the electronic component, the heat sink assembly comprising:

a heat sink comprising a base having a bottom face contacting with the electronic component and a plurality of fins extending upwardly from a top face of the base, a channel being defined in the fins of the heat sink above the base; and a locking device assembly mounted on the heat sink and securing the heat sink on the electronic component, the locking device assembly comprising:

a pressing member spanning across the channel in a manner such that the pressing member has a middle, bottom face abutting against the heat sink and is pivotable to the heat sink; and a pair wire clips mounted on opposite ends of the pressing member, the wire clips being located on opposite lateral sides of the heat sink and securing with the printed circuit board so that the pressing member exerts a force on the heat sink toward the electronic component, wherein two adjacent ones of the fins form bulges toward each other, the pressing member forms two posts extending outwardly from two lateral sides of the pressing member, respectively, and the two posts are received in a space between the bulges and located near the middle, bottom face of the pressing member.

17. The electronic assembly as claimed in claim 16, wherein the pressing member is resilient and generally V-shaped with two arms, each of the two arms has a slot in a bottom face thereof and two grooves in a top face thereof, each of the wire clips has an engaging portion fitted in the slot, two extension portions extend outwardly from the engaging portion along opposite directions, respectively, the extension portions are fitted in the grooves, respectively, and two locking portions extend downwardly from the extension portions, respectively, the locking portions secure with the printed circuit board.

* * * * *